US011705888B2

United States Patent
Satoh et al.

(10) Patent No.: US 11,705,888 B2
(45) Date of Patent: *Jul. 18, 2023

(54) ZQ CALIBRATION USING CURRENT SOURCE

(71) Applicant: Micron Technology, Inc., Boise, ID (US)

(72) Inventors: Yasuo Satoh, Tsukuba (JP); Hiroki Takahashi, Inagi (JP); Shuichi Tsukada, Sagamihara (JP); Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 354 days.

This patent is subject to a terminal disclaimer.

(21) Appl. No.: 17/086,792

(22) Filed: Nov. 2, 2020

(65) Prior Publication Data

US 2021/0111706 A1   Apr. 15, 2021

Related U.S. Application Data

(63) Continuation of application No. 16/598,964, filed on Oct. 10, 2019, now Pat. No. 10,886,898.

(51) Int. Cl.
*H03K 19/00* (2006.01)
*H03H 11/54* (2006.01)
*H03H 11/28* (2006.01)

(52) U.S. Cl.
CPC .............. *H03H 11/54* (2013.01); *H03H 11/28* (2013.01); *H03K 19/0005* (2013.01); *G11C 2207/2254* (2013.01)

(58) Field of Classification Search
CPC .... H03H 11/54; H03H 11/28; H03K 19/0005; G11C 2207/2254
See application file for complete search history.

(56) References Cited

U.S. PATENT DOCUMENTS

| | | | |
|---|---|---|---|
| 6,307,791 B1 | 10/2001 | Otsuka et al. | |
| 9,780,785 B2 * | 10/2017 | Hardee | G11C 7/1057 |
| 2002/0063575 A1 | 5/2002 | Kim et al. | |
| 2005/0052200 A1 | 3/2005 | Nguyen et al. | |
| 2005/0134303 A1 | 6/2005 | Best et al. | |
| 2008/0100333 A1 | 5/2008 | Kim et al. | |
| 2008/0284467 A1 | 11/2008 | Koo | |
| 2009/0146685 A1 | 6/2009 | Kim et al. | |
| 2011/0109344 A1 | 5/2011 | Choi et al. | |
| 2012/0326768 A1 * | 12/2012 | Bhattacharya | H03F 1/308 327/524 |
| 2016/0211031 A1 * | 7/2016 | Taigor | G11C 5/147 |

* cited by examiner

*Primary Examiner* — Seokjin Kim
(74) *Attorney, Agent, or Firm* — Perkins Coie LLP

(57) ABSTRACT

A memory device includes a terminal calibration circuit having at least one of a pull-down circuit or a pull-up circuit used in calibrating an impedance of a data bus termination. The memory device also includes a reference calibration circuit configured to generate a calibration current. The terminal calibration circuit can be configured to program an impedance of the least one of a pull-down circuit or a pull-up circuit based on the calibration current.

18 Claims, 13 Drawing Sheets

US 11,705,888 B2

ZQ CALIBRATION USING CURRENT SOURCE

CROSS-REFERENCE TO RELATED APPLICATIONS

This application is a continuation of U.S. application Ser. No. 16/598,964, filed Oct. 10, 2019; which is incorporated herein by reference in its entirety.

TECHNICAL FIELD

The present disclosure is directed to systems and methods for ZQ calibration in memory systems, and more particularity to ZQ calibration using a current source.

BACKGROUND

Semiconductor systems, such as semiconductor memory and processors, transmit data across data communication lines that are configured to have carefully matched impedance values. Variations in certain operating parameters such as temperature or the like can result in impedance mismatches that can adversely affect data transmission rates and quality. In order to mitigate these adverse scenarios, the semiconductor systems can include termination components that have programmable impedances, which can be adjusted based on a calibration process as operating conditions change. In some implementations, the impedances of the termination components are programmed based on voltage measurements made on a connection pad attached to an external connection (also referred to herein as an "external pin" or "pin") of a semiconductor memory package. The external pin can connect to an external reference calibration device such as, for example, a resistor. However, the number of external pins that are available on the typical semiconductor memory package is limited and, typically, only one external reference calibration device per memory package is provided. In a case where the semiconductor system is a memory such as a SRAM or DRAM, the memory system can include a memory package that has multiple semiconductor components (e.g., semiconductor dies) that each contains one or more memory devices, which contain the memory cells and the termination components. In such memory systems, each memory device must share the external reference calibration device via the external pin when programming the respective termination component based on the results of the calibration process. However, as the number of memory devices that share the external reference calibration device increases, the calibration times for the memory systems can get very long.

In addition, some memory devices do not have external reference calibration devices. Thus, periodic calibration in such memory devices is not performed. Although trim settings are available for the termination components, there is no assurance that the resistance values of the termination components will remain unchanged as the memory device temperature changes due to operational and/or ambient temperature changes.

DETAILED DESCRIPTION

The present disclosure is directed to ZQ calibration in a memory system. The memory devices can each include a terminal calibration circuit having a pull-down circuit and/or a pull-up circuit that is used in calibrating an impedance of a data bus termination. The memory device can also include a reference calibration circuit configured to generate a calibration current. In some embodiments, the terminal calibration circuit can be configured to program an impedance of the pull-down circuit and/or the pull-up circuit based on the calibration current.

Figure 1:
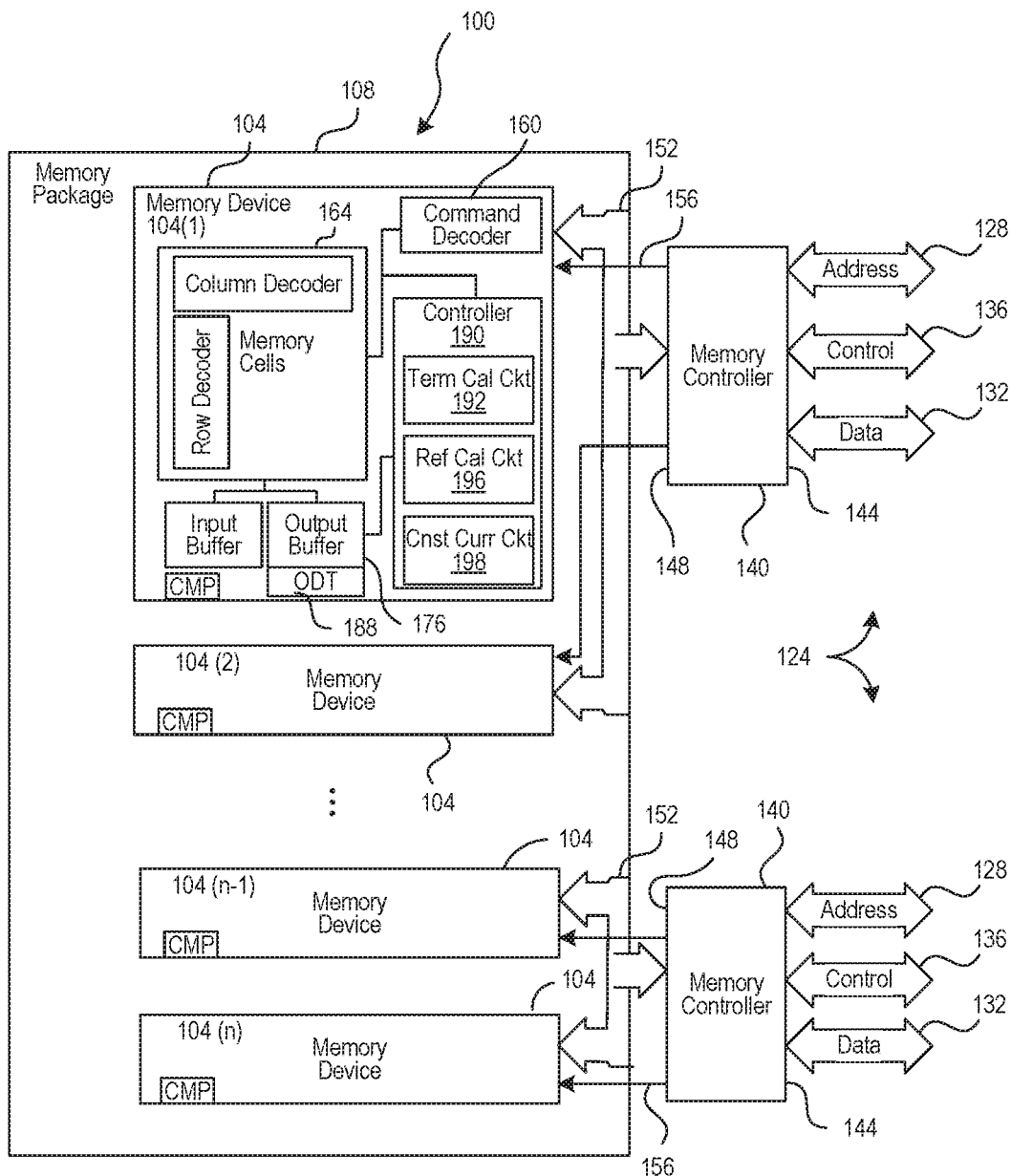
FIG. 1 is block diagram of an embodiment of a memory system in accordance with an embodiment of the present disclosure.

FIG. 1 is block diagram of a memory system in accordance with the present technology. Referring to FIG. 1, the memory system of the present disclosure will be described with reference to a memory system 100, by way of example and not limitation. The memory system 100 may be a volatile memory such as a SRAM or DRAM, or a nonvolatile memory such as a FLASH memory or a ferroelectric memory. In one embodiment, the memory system 100 may be a Double Data Rate (DDR) memory, such as a Low Power Double Data Rate 4 (LPDDR4 or LP4) or Low Power Double Rate 5 (LPDDR5 or LP5) memory. The memory system 100 can be arranged as a component of a computing device such as a laptop computer, a desktop computer, a cellular or other mobile device, a table computer, personal digital assistant, and so on. The memory system 100 can be mounted in an appropriate memory slot or otherwise interconnected with the computing device such that communication can take place through the pins on the package 108 (i.e., memory module) of the memory system 100. A computing device that includes the memory system 100 may generally include one or more processors (not shown in FIG.

1). The processor or processors can be single core or multi-core in various implementations. Typically, the memory system 100 functions as a passive device in the larger system, receiving and executing commands received from a processor or processor core. Here, the computing device may include a bus interface 124 across which the memory system 100 and the processor or processor cores can communicate. As shown in FIG. 1, the bus interface 124 can include an address bus 128, a data bus 132, and a command bus 136. FIG. 1 shows these various buses as separate components by way of example and not limitation. In some instances, the bus interface 124 can multiplex two or more of these separate buses. For example, in some implementations, the address bus 128 and the command bus 136 can be time division multiplexed such that these buses use the same physical lines in different time slices.

The memory system 100 can be associated with one or more memory controllers 140 that are configured to provide data communication to and from the memory system 100. The memory controller 140 can include a front end 144 that communicates across the bus interface 124. Similarly, the memory controller 140 can include a back end 148 that communicates with the memory system 100. Each memory controller 140 can communicate across a separate memory bus 152 that couples the back end 148 of the memory controller 140 to one or more of the memory devices 104 that are associated with the memory system 100. Each memory bus 152 associated with a given controller 140 can include address, data, and control lines that are coupled in common between the various memory devices 104 with which the controller 140 communicates. Each memory bus 152 can additionally include individual chip select lines 156 that can be selectively asserted to enable one of the memory devices 104 to send or receive data across the common address, data, and control lines. Through the combination of individual chip select lines 156 and common address, data, and control lines, a memory bus 152 associated with a given controller 140 provides separate communication pathways between the controller and each of the various memory devices 104 with which the controller 140 communicates.

In accordance with various embodiments, the memory system 100 can include multiple memory devices 104 that can be arranged on one or more semiconductor components such as, for example, semiconductor dies. In some embodiments, each memory device 104 can correspond to a semiconductor component such as, for example, a semiconductor die. However, in other embodiments, multiple memory devices 104 can be installed on the semiconductor component. The package 108 of the memory system 100 can contain and interconnect the semiconductor components, including the memory devices 104. The package 108 can provide multiple external pins (not shown) that couple to contact pads arranged on an interior of the package 108. The pins and pads can provide electrical coupling such as between the memory devices 104(1) to 104(n) and the larger system to which the memory system 100 is coupled, as discussed above.

In operation, a processor or processor core sends a command to the memory system 100 by first sending the command across the bus interface 124. A memory controller 140 receives the command from across the bus interface 124 and routes the command to the appropriate memory device 104 on the memory system 100. Here, the memory controller 140 asserts the appropriate chip select line 156 and sends the command across the common address, data, and control lines of the memory bus 152. The appropriate memory device 104 receives the command from the memory controller 140 and initially processes the command through the operation of a command decoder 160. The command decoder 160 can be configured to recognize a plurality of commands that correspond to various operations that may be executed by the memory device 104. In the following discussion, a calibration command is described in order to more particularly illustrate certain embodiments of the present disclosure. It should be appreciated, however, that the command decoder 160 is generally configured to recognize and decode a number of commands that are not specifically discussed herein such as, for example read/write commands sent to memory array 164. Discussion of those various commands and illustration in the drawings of specific components related to those commands are omitted for the sake of clarity and brevity.

In some embodiments, a calibration command can instruct the controller 190 of the memory device 104 to calibrate an impedance of each termination of termination component 188. In some embodiments, the termination component can be an On-Die Termination (ODT) circuit. As known, an ODT circuit can be adjusted to provide a matched impedance with respect to a connected data bus. In FIG. 1, the termination component 188 is depicted independently of the output buffer 176. However, it is also possible that the output buffer includes the termination component 188 as a part of the output buffer. In such cases, the ODT operation is performed by at least a part of the output buffer. For clarity, exemplary embodiments of the disclosure will be discussed with respect to termination component 188. However, those skilled in the art will recognize that the description is also applicable to cases in which the termination component 188 is part of the output buffer 176.

Upon receipt, the command decoder 160 routes the calibration command to the controller 190, which can be configured to adjust impedances of the terminations in the termination component 188 based on a calibration procedure initiated by the calibration command. Calibration of the impedances of the terminations in the termination component 188 may be needed because the impedances of the terminations can vary due to a change in the operating conditions such as, for example, temperature changes that occur during the operation of the memory system 100. In some embodiments, each termination of the termination component 188 can include a group of pull-up and pull-down transistors that are controlled (e.g., enabled (ON) or disabled (OFF)) by the controller 190. The controller 190 enables/disables the pull-up and pull-down transistors based on a pull-up code signal and a pull-down code signal, respectively, so that the impedance of the termination component 188 and thus the output buffer 176 matches the impedance of the connected data bus. In this way, signal reflections that result from impedance mismatches are avoided.

Figure 2:
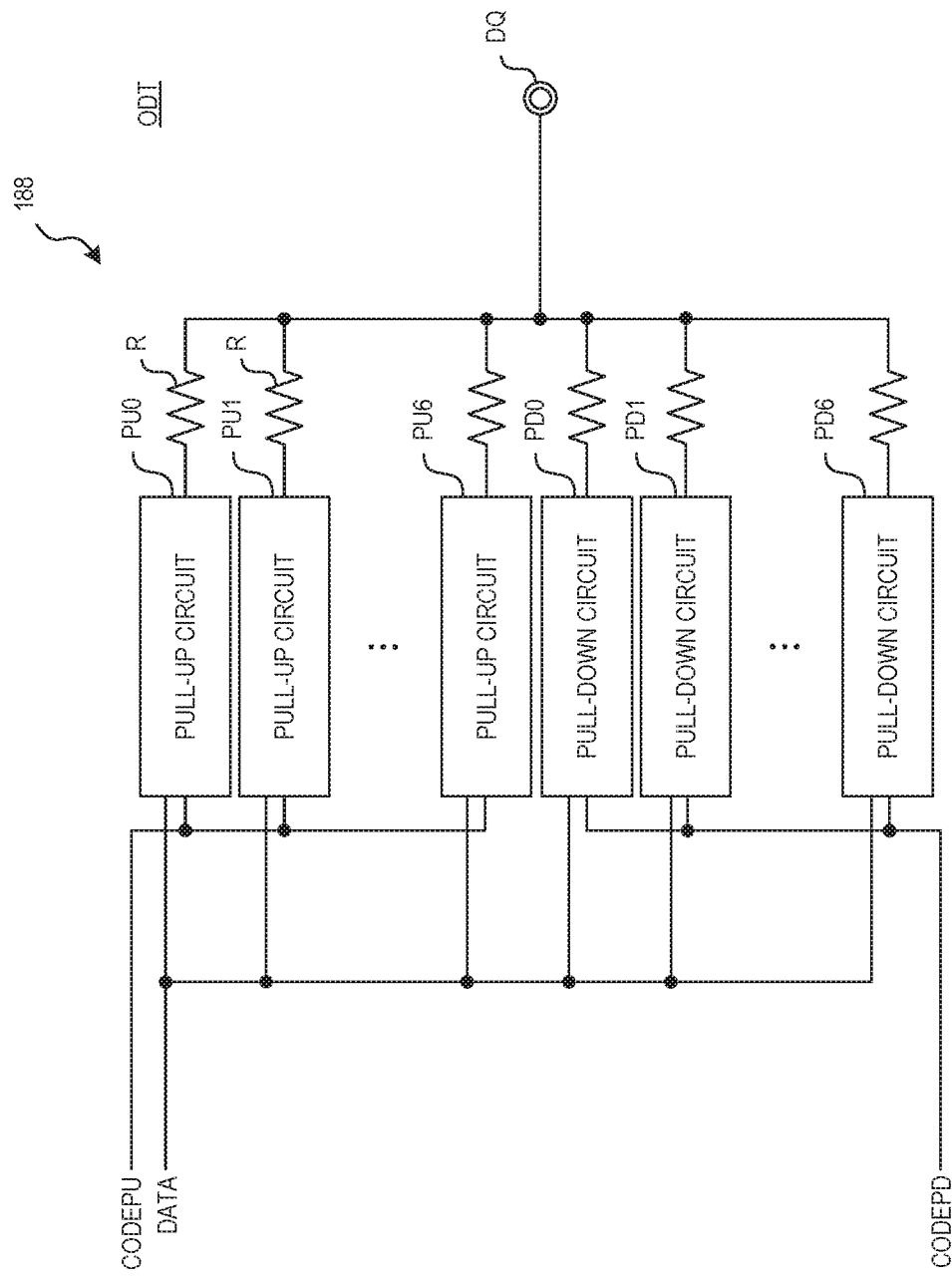
FIG. 2 is a block diagram of an embodiment of a termination component in accordance with an embodiment of the present disclosure.

The termination component 188 can include one or more pairs of pull-up circuits and pull-down circuits for each data input/output terminal. For example, in the illustrated embodiment of FIG. 2, the termination component 188 includes seven pull-up circuits PU0 to PU6 and seven pull-down circuits PD0 to PD6 for one data input/output terminal (or data bit) DQ. Each of the pull-up circuits PU0 to PU6 have the same circuit configuration, which includes a group of pull-up transistors, as known in the art. Similarly, each of the pull-down circuits PD0 to PD6 have the same circuit configuration, which includes a group of pull-down transistors, as known in the art. The output nodes of the pull-up circuits PU0 to PU6 and pull-down circuits PD0 to PD6 can be connected in common to a corresponding data input/output terminal DQ via resistors R.

Figure 3A:
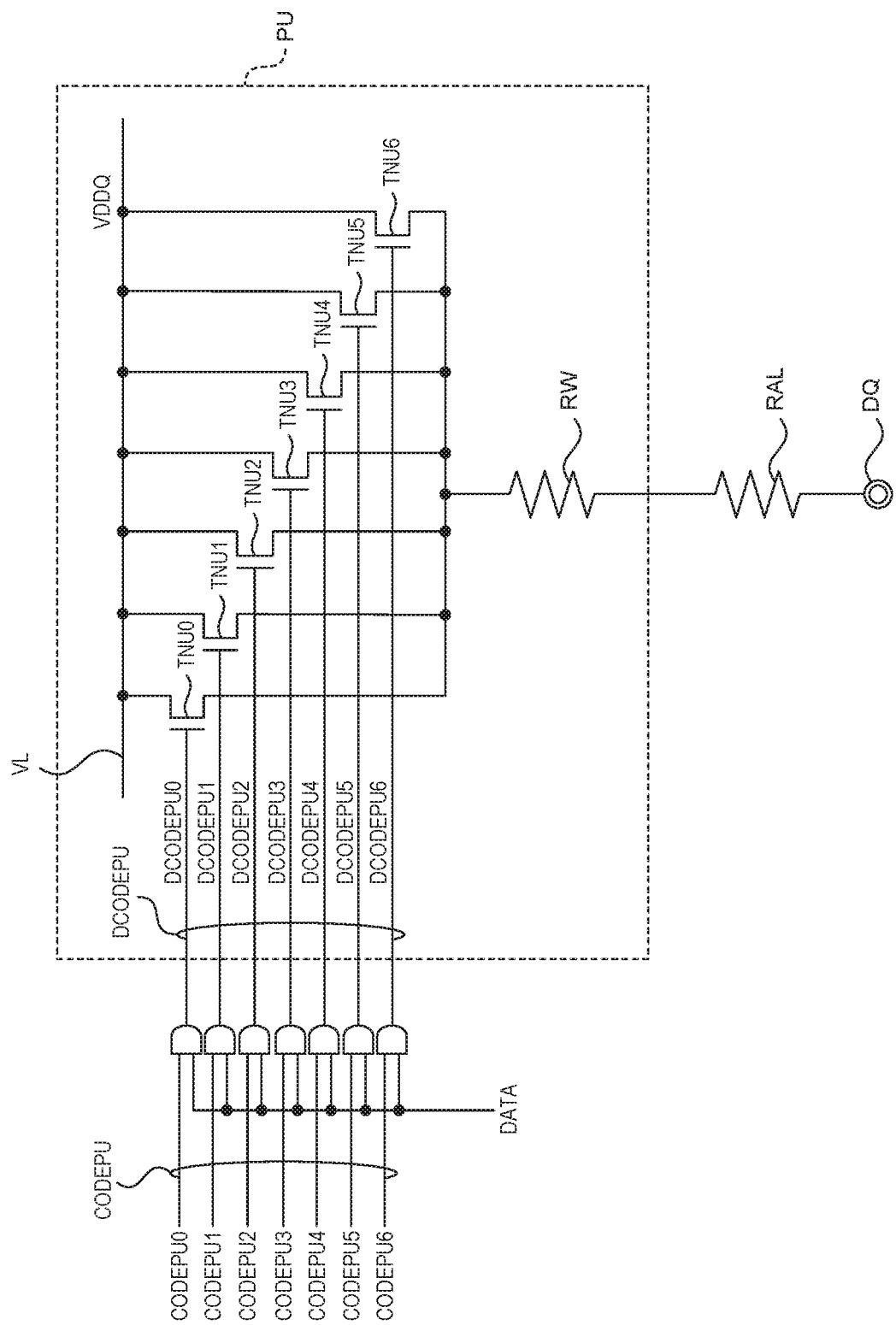
FIG. 3A is a schematic of an embodiment of a pull-up circuit in accordance with an embodiment of the present disclosure.
Figure 3B:
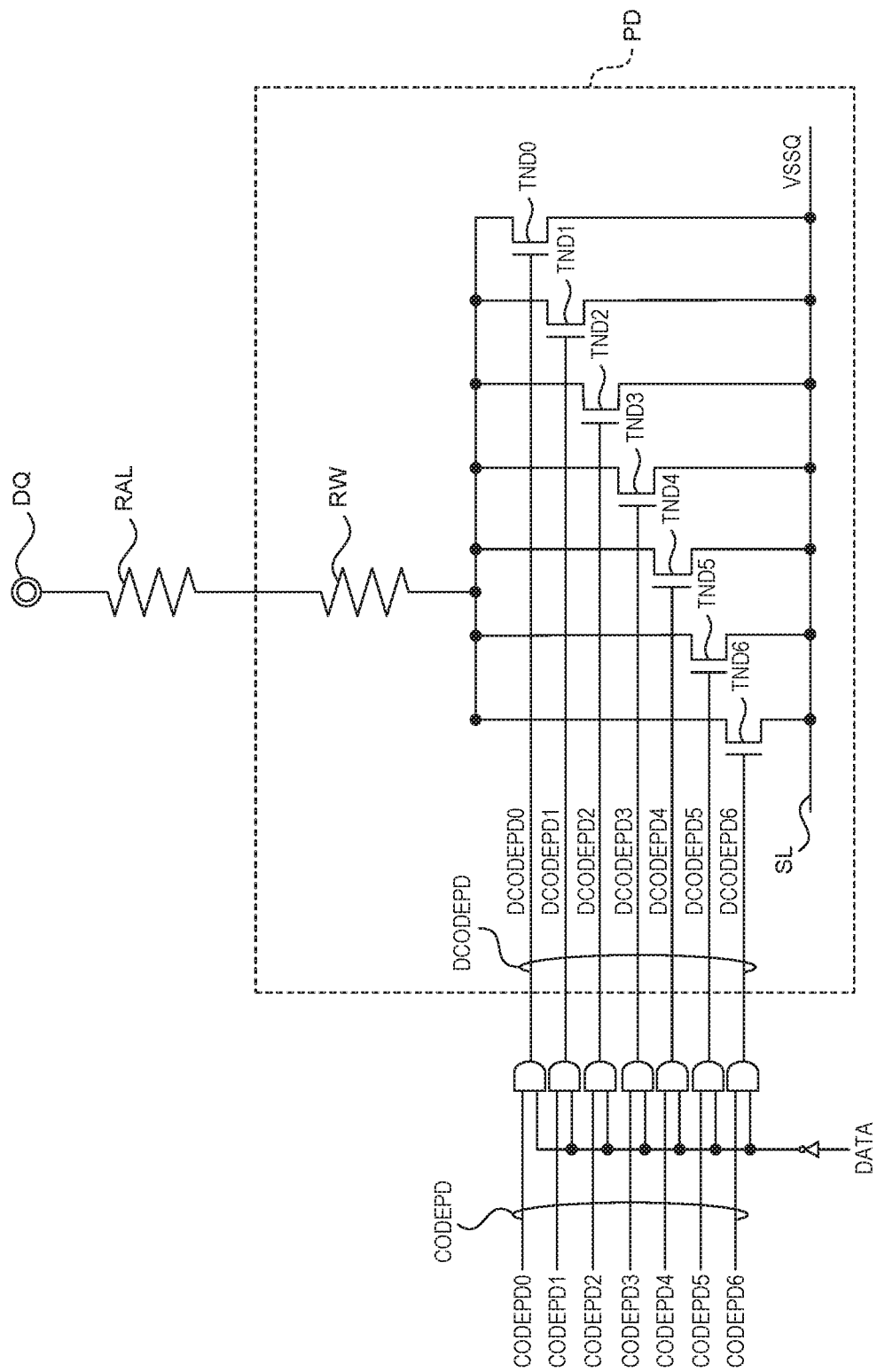
FIG. 3B is a schematic of an embodiment of a pull-down circuit in accordance with an embodiment of the present disclosure.

FIGS. 3A and 3B illustrate exemplary embodiments of a pull-up circuit and a pull-down circuit, respectively. Turning to FIG. 3A, the pull-up circuit PU includes seven N-channel MOS transistors TNU0 to TNU6 (which are connected in parallel), and resistors RW and RAL. Alternatively, the pull-up circuit PU can include P-channel MOS transistors. The drains of the transistors TNU0 to TNU6 can be connected in common to a power supply line VL, which supplies the power supply potential VDDQ. The sources of the transistors TNU0 to TNU6 can be connected to the data input/output terminals DQ via the resistors RW and RAL. The resistor RW can be made of tungsten wire or the like, and can be about 120 ohms, for example. The resistor RAL can be made of aluminum wire, or the like, and can be a small resistor that is less than or equal to 1 ohm, for example.

The bits DCODEPU0 to DCODEPU6 of the code control signal DCODEPU are respectively supplied to the gate electrodes of the transistors TNU0 to TNU6. Accordingly, the seven transistors TNU0 to TNU6 can be controlled based on the value of the code control signal DCODEPU in such a way as to be selectively turned ON or OFF. As shown in FIG. 3A, the code control signal DCODEPU is generated by logically combining, by using an AND gate circuit, each bit of a code signal CODEPU and an internal data bit DATA. When the internal data bit DATA is at a low level, all the bits DCODEPU0 to DCODEPU6 of the code control signal DCODEPU are at a low level regardless of the value of the code signal CODEPU. As a result, all the transistors TNU0 to TNU6 are set to OFF. When the internal data bit DATA is at a high level, the value of the code control signal DCODEPU is the same as the value of the code signal CODEPU. As a result, the transistors TNU0 to TNU6 are selectively turned ON or OFF based on the individual bit values of the code control signal DCODEPU. The impedance of the pull-up circuit PU and thus the data input/output terminal DQ can be adjusted according to the value of the code signal CODEPU.

Turning to FIG. 3B, the pull-down circuit PD includes seven N-channel MOS transistors TND0 to TND6 (which are connected in parallel), and resistors RW and RAL. The sources of the transistors TND0 to TND6 can be connected in common to a power supply line SL, which supplies ground potential VSSQ. The drains of the transistors TND0 to TND6 can be connected to the data input/output terminals DQ via the resistors RW and RAL.

The bits DCODEPD0 to DCODEPD6 of the code control signal DCODEPD are respectively supplied to the gate electrodes of the transistors TND0 to TND6. Therefore, the seven transistors TND0 to TND6 can be controlled based on the value of the code control signal DCODEPD in such a way as to be selectively turned ON or OFF. As shown in FIG. 3B, the code control signal DCODEPD is generated by logically combining, by using an AND gate circuit, each bit of a code signal CODEPD and an inverted internal data bit DATA. When the internal data bit DATA is at a high level, all the bits DCODEPD0 to DCODEPD6 of the code control signal DCODEPD are at a low level regardless of the value of the code signal CODEPD. As a result, all the transistors TND0 to TND6 are set to OFF. When the internal data bit DATA is at a low level, the value of the code control signal DCODEPD is the same as the value of the code signal CODEPD. As a result, the transistors TND0 to TND6 are selectively ON or OFF based on the individual bit values of the code control signal DCODEPD. Similar to the pull-up circuit, the impedance of the pull-down circuit PD and thus the data input/output terminal DQ can be adjusted according to the value of the code signal CODEPD. Those skilled in the art understand the paired configuration and operation of pull-up and pull-down circuits in the termination component 188 and thus, for brevity, the configuration and operation of the pull-up and pull-down circuits will not be further discussed.

Turning to FIG. 1, in some embodiments, terminal calibration circuit 192 sets (or calibrates) the impedance value of each termination in the termination component 188 based on a calibration current flow received from a reference calibration circuit 196. As discussed below, in some embodiments, a reference calibration circuit 196 includes a reference calibration device (e.g., reference resistance circuit 530 in FIG. 5) and a calibration current circuit (e.g., see calibration current circuit 540 in FIG. 5) to provide the calibration current. In some embodiments, code signals CODEPU and CODEPD, which are transmitted to termination component 188, can be generated by the terminal calibration circuit 192 based on the calibration current. In exemplary embodiments, the reference calibration circuit 196 can be calibrated prior to the terminal calibration circuit 192 generating the code signals CODEPU and CODEPD. For example, as shown in FIG. 1, each memory device 104 can include a constant current circuit 198 that can be used to calibrate the reference calibration circuit 196. More specifically, in some embodiments, the reference calibration circuit 196 receives a known current (e.g., a temperature-independent current) from the constant current circuit 198 to calibrate the reference calibration device (e.g., reference calibration circuit 530). By using a calibration current, exemplary embodiments of the present technology eliminate the need for an external ZQ resistor.

Figure 4:
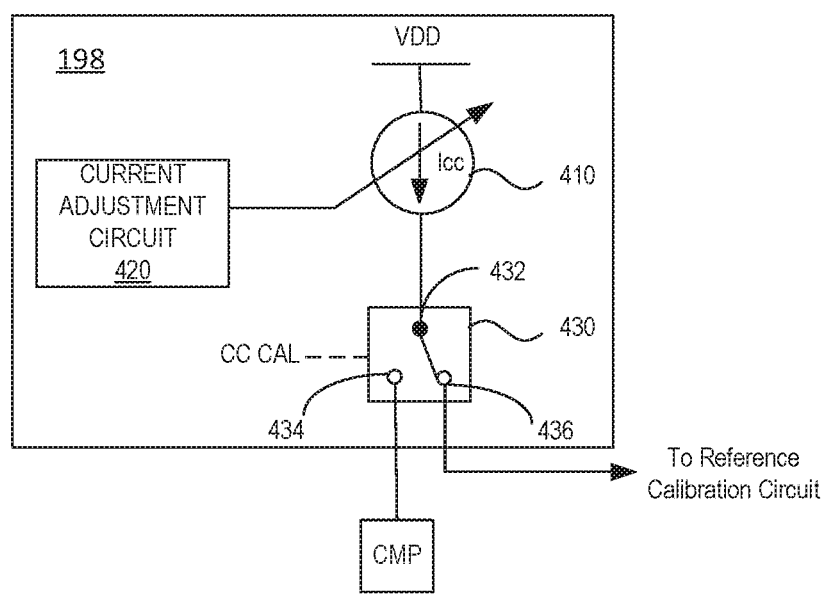
FIG. 4 is a block diagram of a constant current circuit in accordance with an embodiment of the present disclosure.

FIG. 4 illustrates an exemplary embodiment of a constant current circuit 198. As seen in FIG. 4, the constant current circuit 198 includes a current source 410 that is configured to provide a constant output current Icc. In some embodiments, the constant current circuit 198 is a temperature-independent current source, which provides an output current Icc that does not vary with temperature changes in the memory device 104 due to, for example, operating conditions and/or ambient temperature changes. For example, the Icc can remain constant over an operating temperature range of the memory device 104 such as, for example, −40° C. to 125° C. or over some other operating temperature range. In some embodiments, the value of the output current Icc can be adjusted to a desired value, which can depend on the product specification of the memory device 104. For example, the value of Icc can depend on the value of the source voltage VDDQ of the output buffer, the desired resistance values of the resistance circuits in the reference calibration circuit 196, or some other product specification of the memory device 104. For example, if the reference resistance circuit has a value of 120K ohms, the current Icc can be, for example, 2 µA, and if the value of the reference resistance circuit is 240 ohms, the current Icc can be, for example, 1 mA.

To adjust the value of Icc, the constant current circuit 198 can include a current adjustment circuit 420. In some embodiments, the value of Icc can be set during initial factory testing by modifying appropriate trim settings for the current adjustment circuit 420. To aid in adjusting the value of Icc, in some embodiments, the current Icc can be monitored using a current probe via a current monitoring pin ("CMP"), which can be accessed during factory calibration of the memory device 104. For example, the constant current circuit 198 can include a switch 430 that selectively directs an input signal to multiple output connections. In some embodiments, the switch 430 can have an input connection 432 for receiving the current Icc from the constant current source 410. The switch 430 can direct the current Icc either output connection 434 for outputting the current Icc to pin CMP or output connection 436 for outputting the current Icc to a reference calibration circuit such as, for example, reference calibration circuit 196. When an initial factory calibration is performed on constant current source 410, the current path switch 430 can be set to direct the current Icc to output connection 434 and thus pin CMP. The calibration of the current source 410 can be initiated by setting a constant-current calibration signal CC CAL to enable (e.g., ON). In some embodiments, the calibration of the current source 410 is not limited to the factory calibration of the memory device 104 and the memory device 104 can be configured to perform a calibration of the constant current source 410 at other times.

Once calibration has been initiated, the value of the current Icc can be monitored at the pin CMP using a test probe. Based on the monitored readings, the trim settings for the current adjustment circuit 420 can be adjusted as necessary. Once the current Icc has been calibrated to the desired value, the CC CAL signal is disabled (e.g., OFF) and current Icc is directed to output connection 436. In some embodiments, after the factory calibration, the switch 430 is permanently configured to direct the current Icc to the output connection 436 and thus to the reference calibration circuit 196. The configurations of the constant current source 410, the current adjustment circuit 420, and the current path switch 430 are known to those skilled in the art and thus, for brevity, will not be further discussed.

Figure 5:
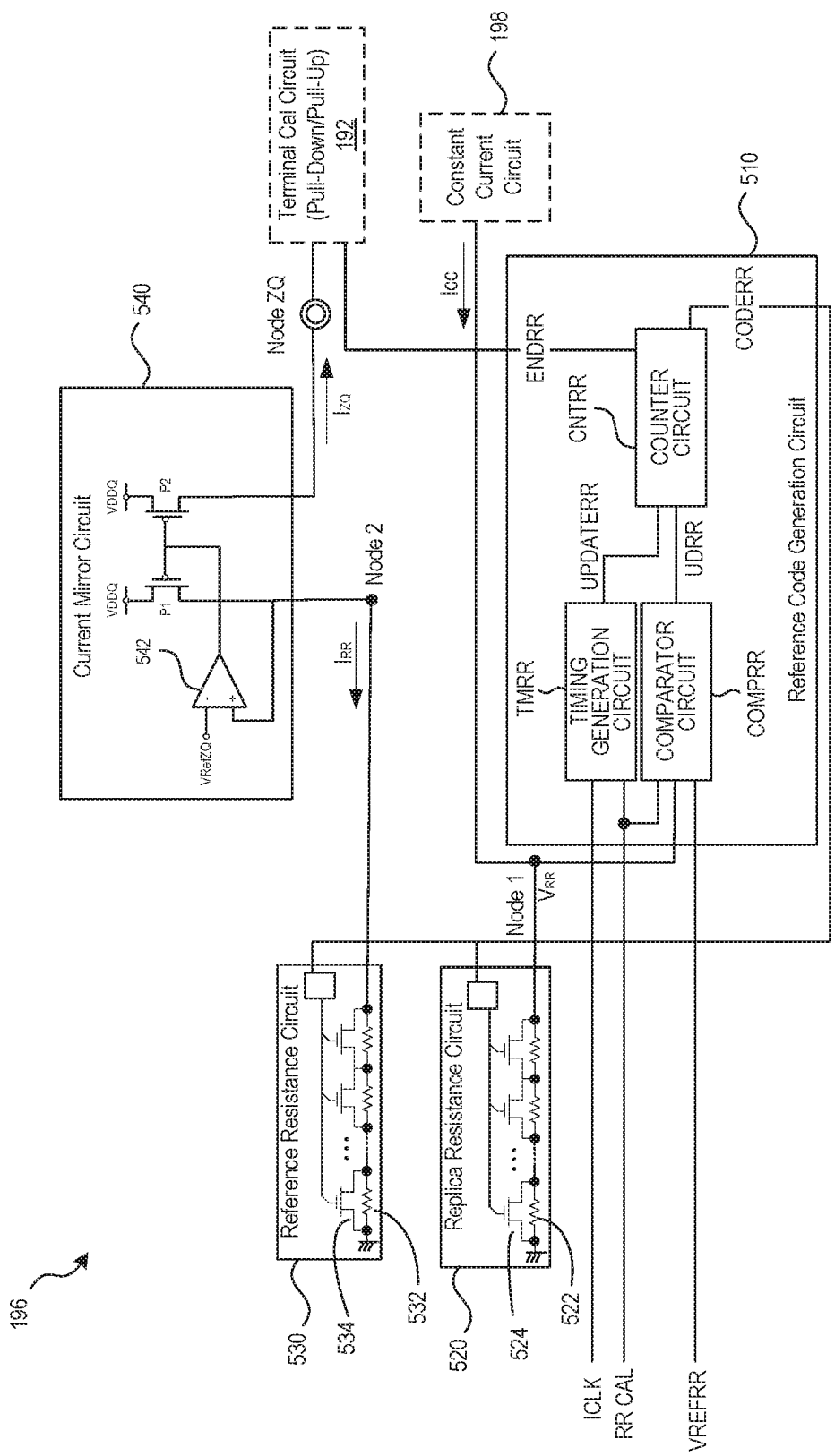
FIG. 5 is a block diagram of a reference calibration circuit in accordance with an embodiment of the present disclosure.

FIG. 5 illustrates an exemplary embodiment of a reference calibration circuit 196 that includes a reference code generation circuit 510, a replica resistance circuit 520, a reference resistance circuit 530, and a current mirror circuit 540. The replica resistance circuit 520 and/or the reference resistance circuit 530 can be, for example, programmable impedance circuits in which, for example, the resistance value is set based on a code signal CODERR. The code signal CODERR can be generated by the reference code generation circuit 510, which is discussed below. In some embodiments, the replica resistance circuit 520 can include one or more resistors 522 and/or the reference resistance circuit 530 can include one or more resistors 532 that can be selectively placed into the respective current paths based on the code signal CODERR. For example, one or more the resistors 522 and/or one or more of the resistors 532 can have transistors 524, 534 disposed in parallel, respectively. Based on the code signal CODERR, the transistors 522 and/or the transistors 534 can be selectively enabled (e.g., ON) to short the corresponding resistor 522, 532 or disabled (e.g., OFF) to open and thus place the respective resistor in the current path. By changing the code signal CODERR, the impedance (e.g., resistance) of the replica resistance circuit 520 and/or the reference resistance circuit 530 can be calibrated to a desired value (also referred to herein as "RR calibration").

In exemplary embodiments of the present technology, the reference code generation circuit 510 can generate the code signal CODERR during RR calibration. Once calibrated, the reference resistance circuit 530 can then be used to calibrate one or more pull-down and/or pull-up circuits in the terminal calibration circuit 192. As explained in more detail below, the terminal calibration circuit 192 generates the code signals CODEPD and CODEPU (also referred to herein as "ZQ calibration") used in, for example, setting the pull-up circuits PU0-PU6 and pull-down circuits PD0-PD6 of the termination component 188, as discussed above. In some embodiments, the RR calibration is initiated prior to every ZQ calibration. That is, prior to the terminal calibration circuit 192 generating the code signals CODEPD and CODEPU, the reference calibration circuit 196 can calibrate the replica resistance circuit 520 and/or the reference resistance circuit 530. In some embodiments, the ZQ calibration and/or the RR calibration can be based on the specification protocol for the memory device 104. In some embodiments, the RR calibration frequency can be the same as the ZQ calibration frequency. In other embodiments, the reference calibration circuit 196 can perform calibrations at a frequency that is greater than or less than that of the calibrations performed by the terminal calibration circuit 192. In some embodiments, the RR calibrations and/or the ZQ calibrations can be performed on a periodic basis, manually, and/or automatically based on criteria (e.g., temperature). For example, RR calibrations and/or ZQ calibrations can be automatically initiated based on the temperature of the memory device 104 and/or a change in the temperature of the memory device 104.

As discussed above, when the CC CAL signal is disabled (e.g., OFF), the current Icc from the current source 410 of the constant current circuit 198 is transmitted to the reference calibration circuit 196. As seen in FIG. 5, the current Icc is sent to the replica resistance circuit 520. The current flows through the replica resistance circuit 520 to generate a potential $V_{RR}$ at node 1 (e.g., $R_{replica}*Icc$), which is received by the comparator circuit COMPRR of the reference code generation circuit 510. The comparator circuit COMPRR also receives a reference potential $V_{REFRR}$.

As seen in FIG. 5, in some embodiments, a calibration of the reference resistance circuit 530 can be initiated based on a status of a RR CAL signal. For example, based on the configuration of the memory device 104, the RR CAL signal can be set to, for example, a high value (e.g., VDDQ) or a low value (e.g., VSSQ) to initiate the RR calibration. In some embodiments, the RR CAL signal and the ZQ CAL signal can be the same signal. The comparator circuit COMPRR compares, in response to the activation of the RR CAL signal, the potential $V_{RR}$ with the reference potential $V_{REFRR}$ and generates an up-down signal UDRR based on the result thereof. The value of reference potential $V_{REFRR}$ is set to a value that will give the desired impedance for the replica impedance circuit 520. In some embodiments, the reference potential $V_{REFRR}$ can be based on the output buffer source voltage VDDQ. For example, a reference potential of ½ VDDQ can be used for $V_{REFRR}$. The up-down signal UDRR is supplied to a counter circuit CNTRR, and a code signal CODEPRR (which is a multi-bit count value of the counter circuit CNTRR) is stepped up or down based on the up-down signal UDD. The stepping-up or stepping-down of the counter circuit CNTRR is performed in synchronization with an update signal UPDATERR. The update signal UPDATERR is generated by a timing generation circuit TMRR in synchronization with the internal clock signal ICLK if the calibration signal RR CAL is activated. The comparator circuit COMPRR performs the comparison between the potential $V_{RR}$ at Node 1 and the reference potential $V_{REFRR}$ until the potential $V_{RR}$ and the reference potential $V_{REFRR}$ are within a predetermined value and/or the counter circuit CNTRR enters a dither condition (e.g., an oscillation between up and down on the up-down signal UDRR). Once the comparison result is within a predetermined value and/or a dither condition is reached, the counter circuit CNTRR can generate a signal ENDRR to indicate that the code signal CODERR is at a calibrated value (also referred to herein as a "calibrated code signal CODERR"). As seen in FIG. 5, the code signal CODERR can be transmitted to the reference resistance circuit 530 during the RR calibration process such that the calibration of the reference resistance circuit 530 is performed simultaneously with the calibration of the replica impedance circuit 520. However, in some embodiments, the replica resistance circuit 520 can be calibrated first and then the calibrated code signal CODERR can be transmitted to the reference resistance circuit 530. After the RR calibration, the calibrated code signal CODERR is at a value that will program the reference resistance circuit 530 to an appropriate impedance for generating a desired calibration current $I_{ZQ}$ for use in the ZQ calibration process. The counter circuit CNTRR maintains the calibrated code signal CODERR value until the next calibration cycle.

The desired values for Icc, $V_{REFRR}$, the replica resistance circuit 520, and/or the reference resistance circuit 530 are not limited to any specific values. In some embodiments, one or more of the values for Icc, $V_{REFRR}$, the replica resistance circuit 520, and the reference resistance circuit 530 can be dependent on the type of memory device 104. In some exemplary embodiments, one or more of the values can be interdependent. For example, the value for $V_{REFRR}$ can depend on the value for Icc and/or the values of the impedances of the replica resistance circuit 520 and/or the reference resistance circuit 530. In some embodiments, the replica resistance circuit 520, and/or the reference resistance circuit 530 can have a desired resistance value that is 240 ohms or greater. For example, the desired impedance (e.g., resistance) value of the replica resistance circuit 520, and/or the desired impedance (e.g., resistance) value of the reference resistance circuit 530 can be 1 k ohms or greater, 10 k ohms or greater, or 100 k ohms or greater. The larger the resistance value of the replica resistance circuit 520, and/or the reference resistance circuit 530, the lesser the effect of the parasitic resistances on the RR and ZQ calibration processes. In some exemplary embodiments (and for purposes of explanation), the desired resistance value of the replica resistance circuit 520, and/or the reference resistance circuit 530 can be 120 k ohms. In addition, the constant current circuit 198 can be factory calibrated, as discussed above, to output a current Icc of 2 μA (of course, other embodiments can output more than 2 μA or less than 2 μA). Based on the desired resistance value of 120 K ohms and a constant current Icc value of 2 μA, the reference voltage $V_{REFRR}$ can be set at 0.24 V (120 k ohms*2 μA=0.24 V). Using a current Icc of 2 μA and a reference voltage $V_{REFRR}$ of 0.24 V, the code signal CODERR value can be calibrated as discussed above to precisely calibrate the replica resistance circuit 520 and/or the reference resistance circuit 530 to 120 k ohms. Once calibrated, the replica resistance circuit 520 and/or the reference resistance circuit 530 can be used to generate the calibration current $I_{ZQ}$ and/or be used in the ZQ calibration process as discussed below.

In some embodiments, the reference calibration circuit 196 can include a current mirror circuit 540 to generate the calibration current $I_{ZQ}$. The current mirror circuit 540 can include transistor circuits P1 and P2 arranged to form a current mirror configuration. The transistor circuit P1 can be configured to provide a reference current $I_{RR}$ to the reference resistance circuit 530, and the transistor circuit P2 can be configured to provide the calibration current $I_{ZQ}$ to the terminal calibration circuit 192. In some embodiments, the calibration current $I_{ZQ}$ can be based on a ratio of the desired resistance value of the reference resistance circuit 530 to a desired resistance value of the pull-down circuit and/or pull-up circuit in the terminal calibration circuit 192. For example, if the desired resistance value of the reference resistance circuit 530 is 120 k ohm and the desired resistance value of the pull-down circuit in the terminal calibration circuit 192 is 240 ohms, the ratio of the resistances is 500 (120 k/240) and the ratio of $I_{ZQ}$ to $I_{RR}$ can be set at 500. Of course, depending on the configuration of the reference resistance circuit 530 and the pull-up and/or pull-down circuits in the terminal calibration circuit 192, the ratio can be greater than 500 or less than 500. The current ratio between $I_{ZQ}$ and $I_{RR}$ in the current mirror circuit 540 can be achieved using known methods such as, for example, having different transistor length-to-width ratios between transistor circuits P1 and P2, having different number of transistors between transistor circuits P1 and P2, and/or some other means to achieve the desired current ratio. Alternatively, or additionally, in some embodiments, the desired current ratio between $I_{ZQ}$ and $I_{RR}$ can be active using one or more intermediate current ratio stages (e.g., a first stage can give a ratio of 1:10, a second stage can give a ratio of 10:100, and a third stage can give a ratio of 100:500).

To perform a ZQ calibration, the terminal calibration circuit 192 can receive the calibration current $I_{ZQ}$ (see FIG. 6) that is based on the calibrated resistance value of reference resistance circuit 530. For example, as seen in FIG. 5, the current mirror circuit 540 can include a differential amplifier 542 that can be configured as, for example, a transconductance amplifier. The output of the differential amplifier 542 is connected to the gates of the transistor circuits P1 and P2. The negative (−) input to the differential amplifier 542 can be connected to a reference potential $V_{RefZQ}$. The positive (+) input to the differential amplifier 542 can be connected to node 2, which is the output of the reference resistance circuit 530. The positive (+) input monitors the voltage on node 2 and the differential amplifier 542 adjusts the output to the gates of the transistor circuits P1 and P2 until the reference current $I_{RR}$ through the calibrated reference resistance circuit 530 produces a voltage that equals $V_{RefZQ}$ at node 2. During a ZQ calibration, the reference current $I_{RR}$ is controlled so as to maintain the potential at node 2 at $V_{RefZQ}$. Due to the current mirroring function of the current mirror circuit 540, the calibration current $I_{ZQ}$ will be maintained at the proper ratio (e.g., 500) with respect to the reference current $I_{RR}$. In some embodiments, as discussed further below, as the calibration current $I_{ZQ}$ flows through the terminal calibration circuit 192, the appropriate pull-down circuit of the terminal calibration circuit 192 is calibrated so that a potential at node ZQ matches the voltage $V_{RefZQ}$. In some embodiments, one or more reference pull-down circuits and/or one or more reference pull-up circuits can be calibrated using the calibration current $I_{ZQ}$ with appropriate circuitry. In some exemplary embodiments, the voltage $V_{RefZQ}$ can be based on, for example, an output buffer source voltage. For example, the voltage $V_{RefZQ}$ can be ½ VDDQ.

Figure 6:
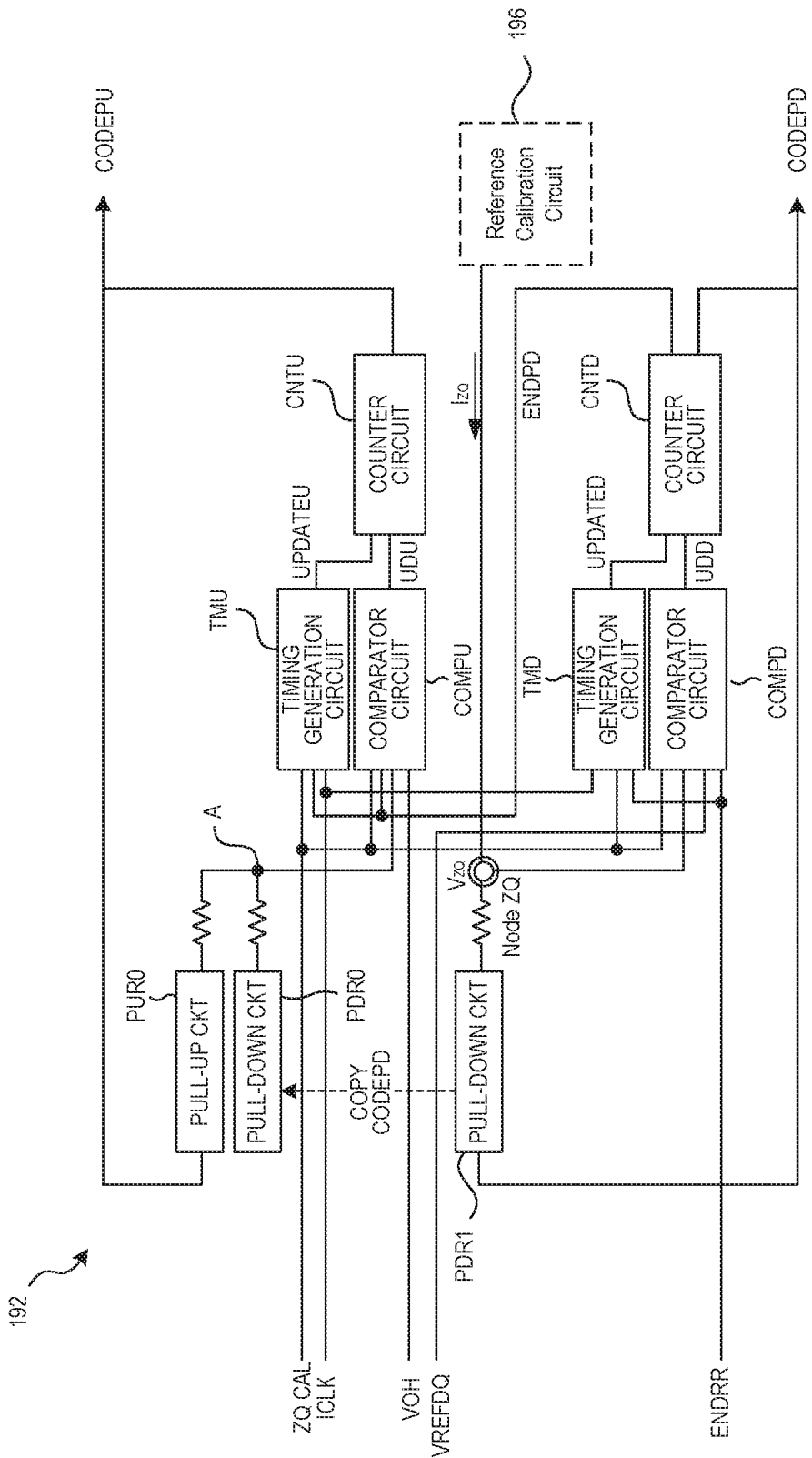
FIG. 6 is a block diagram of a terminal calibration circuit in accordance with an embodiment of the present disclosure.

FIG. 6 illustrates an exemplary embodiment of a terminal calibration circuit 192 that can generate the code signals CODEPU and CODEPD used to program the terminations in termination component 188 of the respective memory devices 104. The calibration current $I_{ZQ}$ from the reference calibration circuit 196 is used in the calibration of the pull-down circuit PDR1. In some embodiments, the configuration of the pull-down circuit PDR1 can be similar to the configuration of the pull-down circuit PD shown in FIG. 3B. As shown in FIG. 6, the calibration current $I_{ZQ}$ flows through the pull-down circuit PDR1 to generate a potential $V_{ZQ}$ at the output of the pull-down circuit PDR1 (node ZQ).

The potential $V_{ZQ}$ is received by a comparator circuit COMPD. The comparator circuit COMPD compares, in response to the activation of the calibration command signal ZQ CAL and the ENDRR signal, the potential $V_{ZQ}$ with the reference potential $V_{REFDQ}$ and generates an up-down signal UDD based on the result thereof. In some embodiments, the ENDRR signal can initiate the ZQ calibration process without the need to have a separate ZQ CAL signal. That is, the ENDRR signal can be the ZQ CAL signal. In some embodiments, the reference potential $V_{REFDQ}$ can be based on the output buffer voltage source. The reference potential $V_{REFDQ}$ can be set to a value that will give the desired impedance for the pull-down circuit. For example, the reference potential $V_{REFDQ}$ of ½ VDDQ can be used in order to get a desired impedance for the pull-down circuits PD0-PD6 in the termination component 188. The up-down signal UDD is supplied to a counter circuit CNTD, and a code signal CODEPD (which is a multi-bit count value of the counter circuit CNTD) is stepped up or down based on the up-down signal UDD. The stepping-up or stepping-down of the counter circuit CNTD is performed in synchronization with an update signal UPDATED. The update signal UPDATED is generated by a timing generation circuit TMD in synchronization with the internal clock signal ICLK if the ZQ CAL and ENDRR signals are activated. The comparator circuit COMPD performs the comparison between the potential $V_{ZQ}$ and the reference potential $V_{REFDQ}$ until the potential $V_{ZQ}$ and the reference potential $V_{REFDQ}$ are within a predetermined value and/or the counter circuit CNTD enters a dither condition (e.g., an oscillation between up and down on the up-down signal UDD). Once the comparison result is within a predetermined value and/or a dither condition is reached, the counter circuit CNTD can generate a signal ENDPD to indicate that the code signal CODEPD is at a calibrated value (also referred to herein as a "calibrated code signal CODEPD"). That is, the code signal CODEPD is at a value that will program the pull-down circuits in termination component 188 to an impedance that matches the connected data bus. In some embodiments, the desired impedance for the pull-down circuit PDR1 and/or the pull-down circuits PD0-PD6 in the termination component 188 can be 240 ohms. The counter circuit CNTD maintains the calibrated code signal CODEPD value until the next calibration cycle.

To generate the code signal CODEPU, exemplary embodiments of the present technology can use a pull-down circuit that has been programmed with the calibrated code signal CODEPD. As shown in FIG. 6, after programming the pull-down circuit PDR1, the calibrated code signal CODEPD is copied to the pull-down circuit PDR0. Of course, the counter circuit CNTD can also update the pull-down circuit PDR0 with an intermediate code signal CODEPD during the calibration process at the same time the updates are sent to the pull-down circuit PDR1. Based on the calibrated code signal CODEPD, the appropriate transistors in pull-down circuit PDR0 are turned ON or OFF (programmed) to set (or calibrate) the desired impedance. The pull-down circuit PDR0 programmed with the desired impedance can then be used to determine the calibrated code signal CODEPU.

As shown in FIG. 6, the pull-up circuit PUR0 and pull-down circuit PDR0 are connected at a common connection point A. The connection point A, along with the ZQ calibration signal ZQ CAL and ENDPD signals, is connected to a comparator circuit COMPU. The comparator circuit COMPU, in response to the activation of the ZQ calibration signal ZQ CAL and the signal ENDPD, compares the potential of the connection point A with the reference potential VOH and generates an up-down signal UDU based on the result thereof. The up-down signal UDU is supplied to a counter circuit CNTU, and a code signal CODEPU, which is a count value of the counter circuit CNTU, is stepped up or stepped down based on the up-down signal UDU. The stepping-up or stepping-down of the counter circuit CNTU is performed in synchronization with an update signal UPDATEU. The update signal UPDATEU is generated by a timing generation circuit TMU in synchronization with the internal clock signal ICLK if the ZQ calibration signal ZQ CAL and an end signal ENDPD are activated. The comparator circuit COMPU performs the comparison between the potential at point A and the reference potential VOH until the potential of point A and the reference potential VOH are within a predetermined value and/or the counter circuit CNTU enters a dither condition (e.g., an oscillation between up and down on the up-down signal UDU). In some exemplary embodiments, the reference voltage VOH can be based on, for example, an output buffer source voltage. For example, in the exemplary embodiment of FIG. 6, VOH can be ½ VDDQ. Once the comparison result is within a predetermined value and/or a dither condition is reached, the counter circuit CNTU maintains the last code signal CODEPU as the calibrated code signal CODEPU, and the calibrated code signal CODEPU is used to program the pull-up transistors associated with the termination component 188. For example, the impedance values of the pull-down circuit PDR0, the pull-up circuit PUR0, and/or the pull-up transistors PU0-PU6 associated with the termination component 188 can be set (or calibrated) to 240 ohms.

As discussed above, each package 108 can have more than one semiconductor component, such as, for example, a memory die. For example, in some embodiments, the package 108 can have 2, 4, 8, 16 or more semiconductor components (e.g., memory dies), which can each have a memory device 104. In related art systems, the memory devices are connected to a common ZQ pin on the package. To avoid conflicts on the common ZQ pin, an arbiter circuit in each of the memory devices ensures that multiple memory devices do not perform ZQ calibrations concurrently. However, because there can be 16 or more memory devices, sequentially performing all ZQ calibrations can get very long. In contrast, in exemplary embodiments of the present technology, because each memory device 104 includes a terminal calibration circuit 192, a reference calibration circuit 196, and a constant current circuit 198, the ZQ calibrations can be performed concurrently rather than sequentially. Thus, the ZQ calibration time for the entire package 108 is nearly equal to the ZQ calibration time for a single related art memory device.

Figure 7:
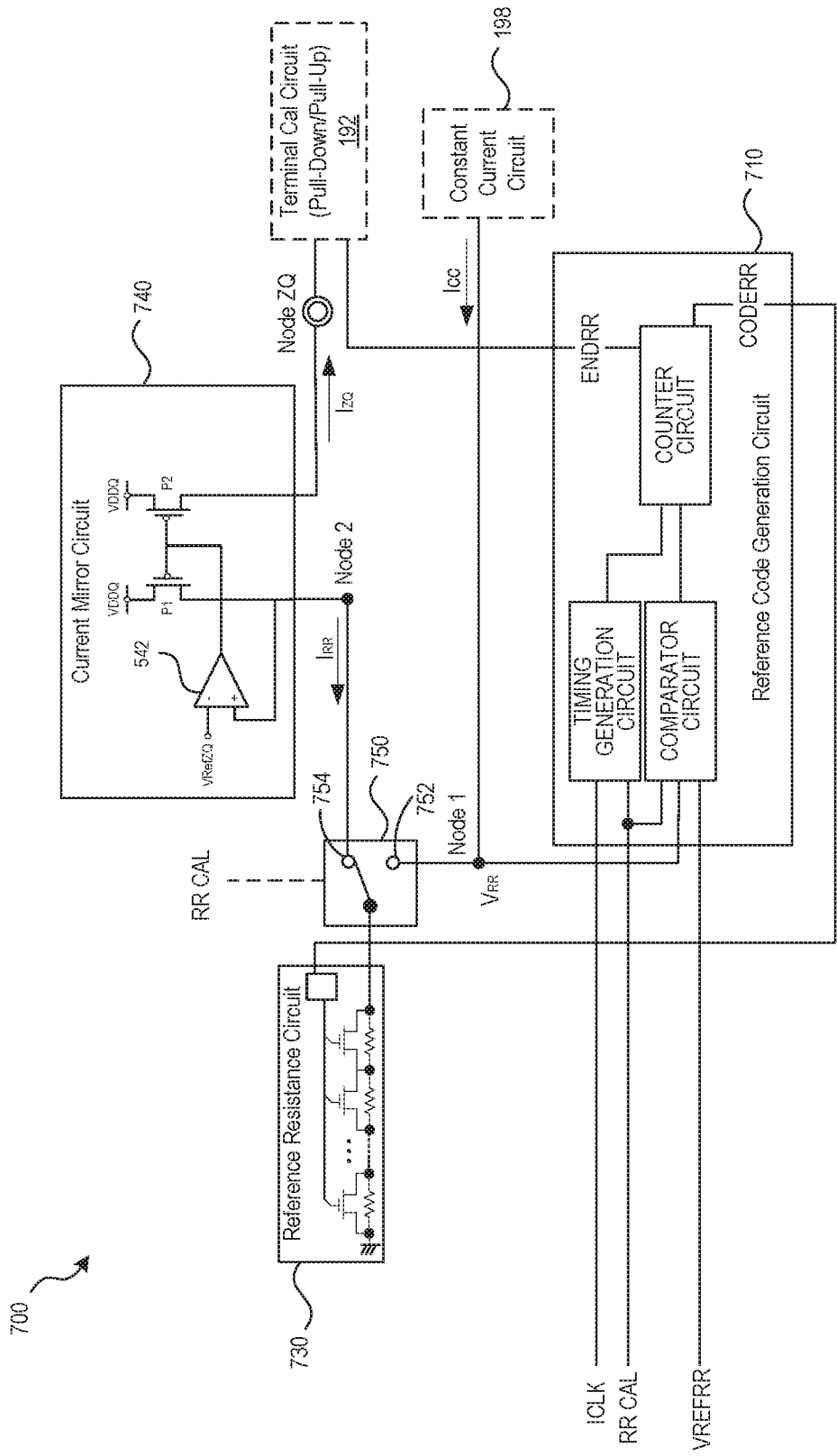
FIG. 7 is a block diagram of a reference calibration circuit in accordance with another embodiment of the present disclosure.

In the embodiment of FIG. 5 the reference calibration circuit 196 calibrates a replica resistance circuit 520 to generate a calibrated code signal CODERR. The calibrated code signal CODERR is then used to calibrate the reference resistance circuit 530, which is used by the terminal calibration circuit 192. In some embodiments, the use of a replica resistance circuit 520 can be eliminated, which can reduce the layout area of the memory device. For example, as seen in FIG. 7, the reference calibration circuit 700 does not include a replica resistance circuit. In addition, the reference resistance circuit 730 is not directly connected to the current mirror circuit 740 as in the embodiment of FIG. 5 with respect to reference resistance circuit 530 and the current mirror circuit 540. Instead, the reference calibration circuit 700 includes a switch 750 that connects the reference resistance circuit 730 to either the reference code generation circuit 710 via node 1 or the current mirror circuit 740 via node 2. In the embodiment of FIG. 7, the configuration of the reference resistance circuit 730 is similar to that of reference resistance circuit 530 and thus, for brevity, will not be further discussed.

When the RR CAL signal is enabled (e.g., ON), the switch 750 connects the reference resistance circuit 730 to terminal 752 and thus to the constant current circuit 198 and the reference code generation circuit 710. During RR calibration, the reference code generation circuit 710 will generate a calibrated code signal CODERR by adjusting the impedance of the reference resistance circuit 730 until the voltage $V_{RR}$ matches the reference voltage $V_{REFRR}$. Those skilled in the art will recognize that the operation of reference code generation circuit 710 is similar to that of the reference code generation circuit 510 of FIG. 5 discussed above. Thus, for brevity, a detailed description of the operation of reference code generation circuit 710 is omitted.

At the end of the RR calibration, the RR CAL signal is disabled (e.g., OFF). When the RR CAL signal is disabled, the switch 750 connects the reference resistance circuit 730 to terminal 754 and thus to the current mirror circuit 740. Those skilled in the art will recognize that the operation of the current mirror circuit 740 and the subsequent ZQ calibration process (using the current mirror circuit 740 and terminal calibration circuit 192) will be similar to that of the current mirror circuit 540 and the ZQ calibration process of FIGS. 5 and 6 discussed above. Thus, for brevity, a detailed description of the operation of current mirror circuit 740 and the ZQ calibration process using the current mirror circuit 740 and terminal calibration circuit 192 is omitted. Thus, in the embodiment of FIG. 7, the addition of switch 750 (and the corresponding control logic) allows for the elimination of the replica resistance circuit 520.

Figure 8A:
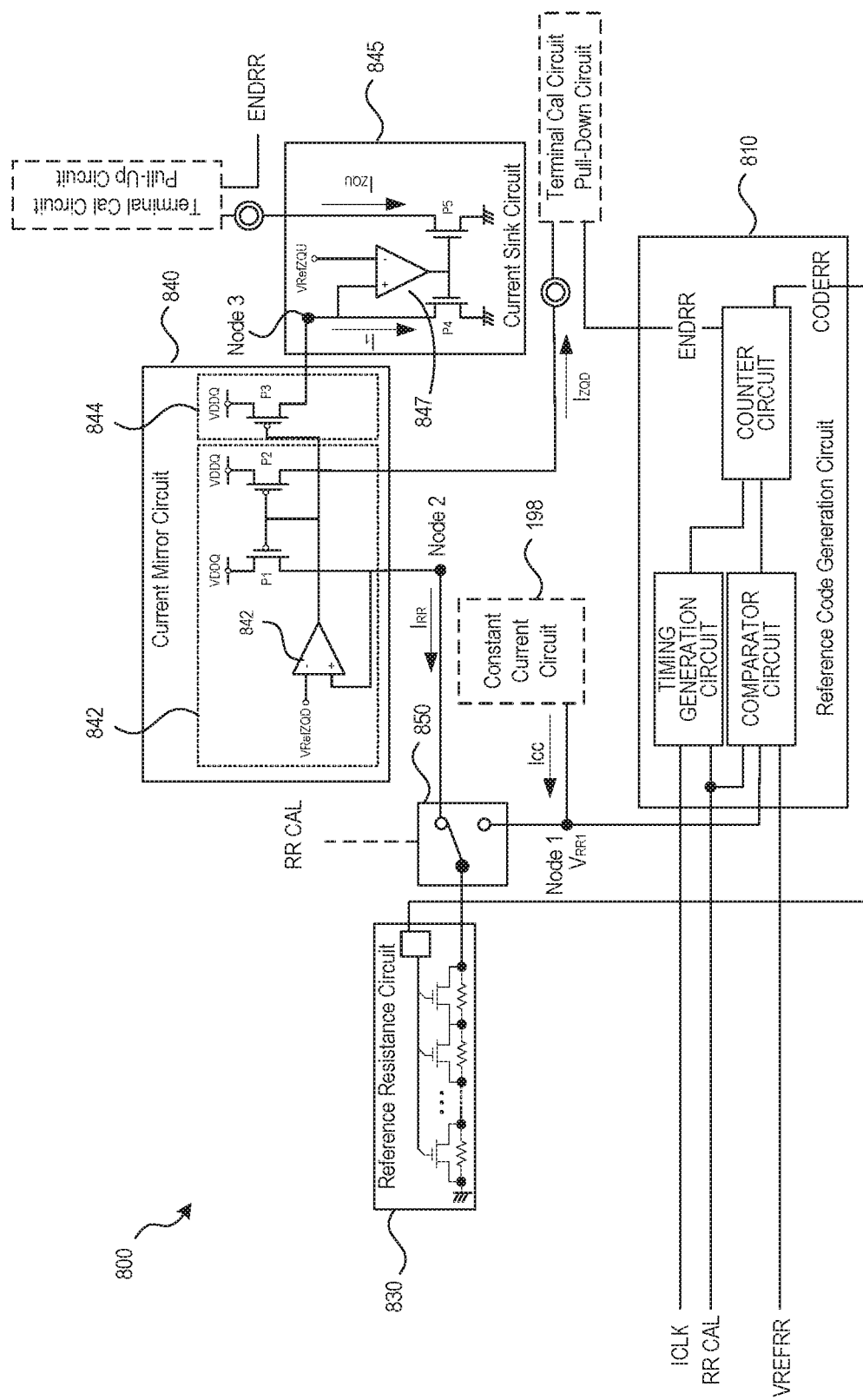
FIG. 8A is a block diagram of a reference calibration circuit in accordance with another embodiment of the present disclosure.
Figure 8B:
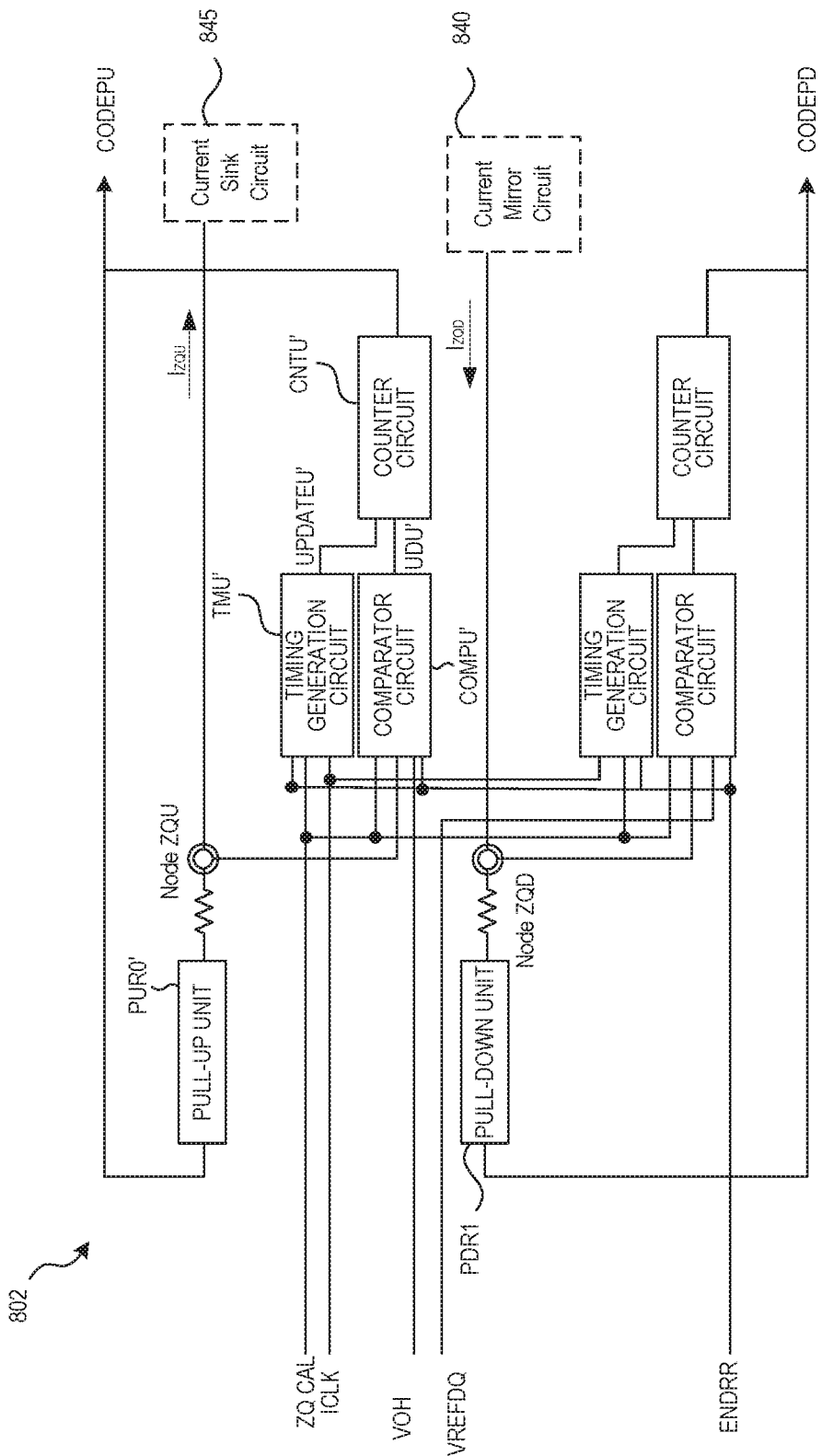
FIG. 8B is a block diagram of a terminal calibration circuit in accordance with another embodiment of the present disclosure.

In the above exemplary embodiments, the calibration of the pull-up circuit PUR0 to generate the code signal CODEPU is performed after the calibration of the pull-down circuit PDR1 to generate the code signal CODEPD. To decrease the ZQ calibration time due to the sequential calibrations of the pull-down and pull-up circuits in the terminal calibration circuit, in some embodiments, the reference calibration circuit and the terminal calibration circuit can be configured such that the code signals CODEPD and CODEPU can be generated simultaneously. FIGS. 8A and 8B respectively illustrate a reference calibration circuit 800 and a terminal calibration circuit 802 that can simultaneously generate the code signals CODEPD and CODEPU.

As seen in FIG. 8A, the impedance calibration circuit 800 can include a switch 850, a reference resistance circuit 830, and reference code generation circuit 810. Those skilled in the art will recognize that the configuration and operation of the switch 850, the reference resistance circuit 830, and the reference code generation circuit 810 are similar to the configuration and operation of the switch 750, the reference impedance circuit 730, and the reference code generation circuit 710, respectively, discussed above. Accordingly, for brevity, discussion of the RR calibration of the reference resistance circuit 830 is omitted.

After the RR calibration, the RR CAL signal is disabled (e.g., OFF) and the switch 850 connects the reference resistance circuit 830 to node 2 and current mirror circuit 840. As seen in FIG. 8A, the transistor circuits P1 and P2 and differential amplifier 842 form a first current mirror portion 842 that is similar to that of current mirror circuit 540 discussed above. Similar to the mirror circuit 540, the transistor circuit P1 of the first current mirror portion 842 can be configured to provide a current $I_{RR}$ to the reference resistance circuit 830, and the transistor circuit P2 can be configured to provide a calibration current $I_{ZQD}$ to the pull-down circuit of the terminal calibration circuit 802. In some embodiments, the reference potential $V_{RefZQD}$ for differential amplifier 842 can be based on, for example, an output buffer source voltage. For example, the voltage $V_{RefZQD}$ can be ½ VDDQ. Those skilled in the art will recognize that the function and operation of the first current mirror portion 842 is similar to that of current mirror circuit 540. Thus, for brevity, a detailed discussion of first mirror portion 842 is omitted.

In some embodiments, as seen in FIG. 8A, the current mirror circuit 840 includes a transistor circuit P3. The current mirror circuit 840 can be configured such that the output of differential amplifier 842 is connected to the gate of transistor circuit P3 to create a second current mirror portion 844 in which transistor circuit P3 provides current $I_1$ to a current sink circuit 845. In some embodiments, the transistor circuit P3 is configured such that the current $I_1$ is the same as the current $I_{ZQD}$. Of course, in other embodiments, the current $I_1$ can be greater than or less than the current $I_{ZQD}$ based on the configuration of the pull-down and pull-up circuits of terminal calibration circuit 802. As seen in FIG. 8A, current sink circuit 845 includes transistor circuits P4 and P5 that can be arranged in a current mirror configuration. The current sink circuit 845 also includes a differential amplifier 847 that can be configured to receive a reference potential $V_{RefZQU}$ at the negative (−) input and the potential of node 3 at the positive (+) input. The output of the differential amplifier 847 is connected to the gates of transistor circuits P4 and P5. The current sink circuit 845 can be configured such that voltage at node 3 is maintained at the reference potential $V_{RefZQU}$ and the current $I_{ZQU}$ through transistor circuit P5 can be at a known current ratio with respect to current $I_1$. For example, the current ratio can be 1:1 and the current $I_{ZQU}$ can be the same as the current $I_1$. In some embodiments, the reference potential $V_{RefZQU}$ can be based on, for example, an output buffer source voltage. For example, the reference potential $V_{RefZQU}$ can be ½ VDDQ.

As seen in FIG. 8B, the current $I_{ZQD}$ from the current mirror circuit 840 is sent to the pull-down circuit PDR1 of terminal calibration circuit 802, and the pull-up circuit PUR0' of terminal calibration circuit 802 sends the current $I_{ZQU}$ to the current sink circuit 845. Those skilled in the art will recognize that the calibration of pull-down circuit PDR1 and the associated generation of the code signal CODEPD is similar to the calibration of pull-down circuit PDR1 and the associated generation of the code signal CODEPD discussed above with respect to terminal calibration circuit 192 (see FIG. 6). Accordingly, for brevity, the pull-down circuit calibration of terminal calibration circuit 802 is not further discussed. However, unlike terminal calibration circuit 192, the calibration of the pull-up circuit PUR0' and the associated generation of the code signal CODEPU is performed concurrently with the generation of the code signal CODEPD in the terminal calibration circuit 802.

To generate the code signal CODEPU in the terminal calibration circuit 802, the memory device 104 is configured such that the pull-up circuit PUR0' of the terminal calibration circuit 802 is connected to the current sink circuit 845 to generate the current $I_{ZQU}$. The flow of current $I_{ZQU}$ through the pull-up circuit PUR0' generates a potential at node ZQU. The potential at node ZQU, the ZQ calibration signal ZQ CAL, and the RR calibration end signal ENDRR are input to a comparator circuit COMPU'. The comparator circuit COMPU', in response to the activation of the ZQ CAL and ENDRR signals, compares the potential of node ZQU with the reference potential VOH and generates an up-down signal UDU' based on the result thereof. The up-down signal UDU' is supplied to a counter circuit CNTU', and a code signal CODEPU', which is a count value of the counter circuit CNTU', is stepped up or stepped down based on the up-down signal UDU'. The stepping-up or stepping-down of the counter circuit CNTU' is performed in synchronization with an update signal UPDATEU'. The update signal UPDATEU' is generated by a timing generation circuit TMU' in synchronization with the internal clock signal ICLK if the ZQ CAL and ENDRR signals are activated. The comparator circuit COMPU' performs the comparison between the potential at node ZQU and the reference potential VOH until the potential of node ZQU and the reference potential VOH are within a predetermined value and/or the counter circuit CNTU' enters a dither condition (e.g., an oscillation between up and down on the up-down signal UDU'). In some exemplary embodiments, the reference voltage VOH can be based on, for example, an output buffer source voltage. For example, in the exemplary embodiment of FIG. 8B, VOH can be ½ VDDQ. Once the comparison result is within a predetermined value and/or a dither condition is reached, the counter circuit CNTU' maintains the last code signal CODEPU as the calibrated code signal CODEPU, and the calibrated code signal CODEPU is used to program the pull-up transistors PU0-PU6 associated with the termination component 188. In this case, the impedance values of the pull-up circuit PUR0' and the pull-up transistors PU0-PU6 associated with the termination component 188 can be 240 ohms.

Figure 9:
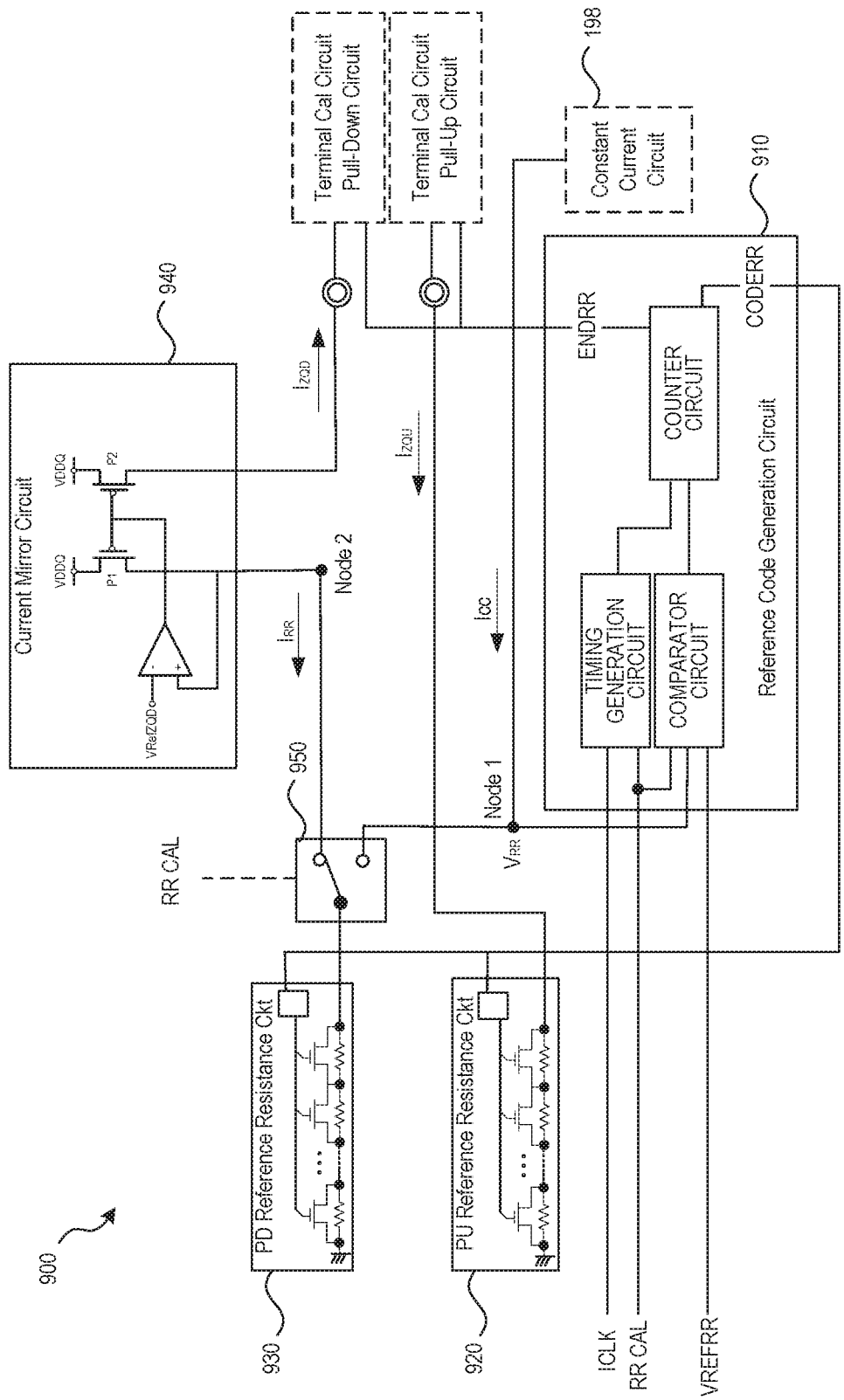
FIG. 9 is a block diagram of a reference calibration circuit in accordance with another embodiment of the present disclosure.

FIG. 9 illustrates another embodiment of the reference calibration circuit in which the pull-up circuit can be calibrated concurrently with the pull-down circuit in the terminal calibration circuit. As seen in FIG. 9, in this exemplary embodiment, the reference calibration circuit 900 includes a PD reference resistance circuit 930 connected to a current mirror circuit 940 via switch 950. During RR calibration, the PD reference resistance circuit 930 is calibrated by the reference code generation circuit 910 and constant current circuit 198. The current mirror circuit 940 outputs a calibration current $I_{ZQD}$ to the pull-down circuit PDR1 (see FIG. 8B). Those skilled in the art will recognize that the operation of the PD reference resistance circuit 930, switch 950, the current mirror circuit 940, reference code generation circuit 910, constant current circuit 198, the RR calibration process, and the ZQ calibration process for the pull-down circuit PUR1 is similar to the operation of reference resistance circuit 730, switch 750, the current mirror circuit 740, reference code generation circuit 510, constant current circuit 198, the RR calibration process, and the ZQ calibration process for the pull-down circuit PUR1 discussed above (e.g., see embodiment of FIG. 7). Thus, for brevity, a discussion of the RR calibration process and the ZQ calibration process for the pull-down circuit PUR1 using the PD reference resistance circuit 930 is omitted. However, although the operation is similar, the configuration of the PD reference resistance circuit 930 and current mirror circuit 940 can differ from the reference resistance circuits and the current mirror circuits discussed above. For example, in the embodiment of FIG. 9, the PD reference resistance circuit 930 can be calibrated to have a resistance value equal to that of the pull-down circuit PDR1 (see FIG. 8B) and/or pull-down circuits PD0-PD6 (see FIG. 3B). For example, the PD reference resistance circuit 930 can be calibrated to have a resistance of 240 ohms. Although the value of the resistance can be different, in some embodiments, the PD reference resistance circuit 930 can have a construction similar to that of reference resistance circuit 530.

Of course, the value of the Icc from the constant current circuit 198 during RR calibration should correspond to the desired resistance value for PD reference resistance circuit 930 and the reference potential $V_{REFRR}$. For example, if $V_{REFRR}$ is 0.24 V and the desired reference value for PD reference resistance circuit 930 is 240 ohms, the setting of the current Icc can be 1 mA. In addition, in embodiments in which the resistances of the PD reference resistance circuit 930 equals that of the pull-down circuit PDR1 (and/or pull-down circuits PD0-PD6), the configuration of the transistor circuits P1 and P2 in the current mirror circuit 940 can be such that the ratio of the currents $I_{RR}$ to $I_{ZQD}$ is 1.

As discussed above, the embodiment of FIG. 9 can concurrently calibrate the pull-up circuit PUR0' with the pull-down circuit PDR1 (see FIG. 8B). To perform the concurrent calibration, the reference calibration circuit 900 can include a PU reference resistance circuit 920 that can be connected to the pull-up circuit PUR0'. In some embodiments, the PU reference resistance circuit 920 can be calibrated to have a resistance value equal to that of the pull-up circuit PUR0' and/or pull-up circuits PU0-PU6 (see FIG. 3A). For example, the PU reference resistance circuit 920 can be calibrated to have a resistance of 240 ohms. Although the value of the resistance can be different, the PU reference resistance circuit 920 can have a construction similar to that of reference resistance circuit 530. Those skilled in the art will recognize that the concurrent ZQ calibration of the pull-up circuit using reference calibration circuit 900 will be similar to that of the calibration of pull-up circuit PUR0' in the embodiment of FIG. 8B. Thus, for brevity, a discussion of the ZQ calibration process for a pull-up circuit using the PU reference resistance circuit 920 is omitted.

Figure 10:
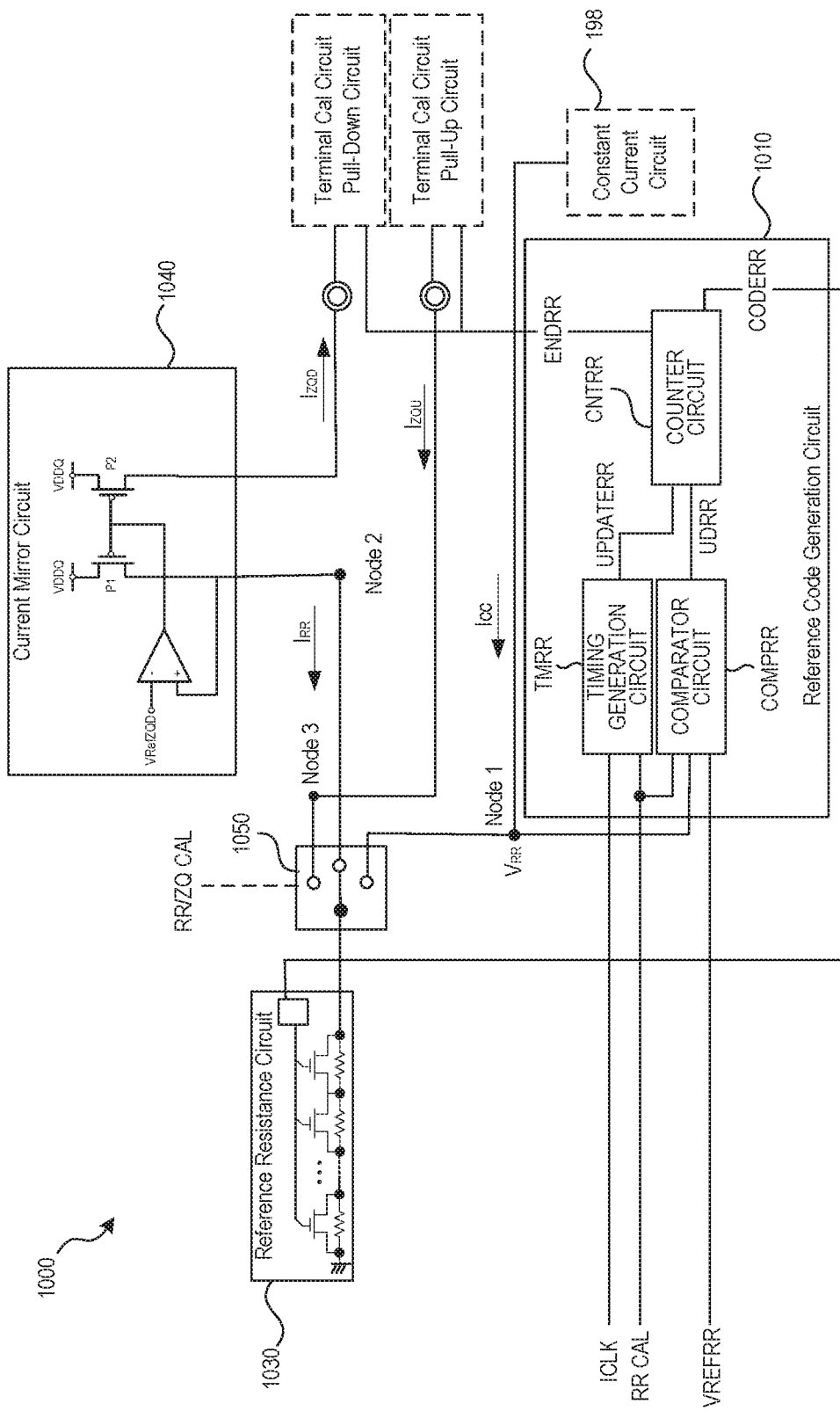
FIG. 10 is a block diagram of a reference calibration circuit in accordance with another embodiment of the present disclosure.

FIG. 10 illustrates another embodiment of the reference calibration circuit. Reference calibration circuit 1000 is similar to the reference calibration circuit embodiment of FIG. 9 in that the reference resistance circuit is configured to have resistance value that is equal to the pull-down circuit PDR1 (and/or pull-down circuit PD0-PD6) and/or equal to the pull-up circuit PUR0 (and/or pull-up circuits PU0-PU6). However, unlike the embodiment of FIG. 9, reference calibration circuit 1000 uses one reference resistance circuit 1030 to sequentially calibrate the pull-down circuit PDR1 and the pull-up circuit PUR0. As seen in FIG. 10, switch 1050 can be controlled by signal RR/ZQ CAL to select node 1 for RR calibration, node 2 for ZQ calibration of the pull-down circuit PDR1, and node 3 for the ZQ calibration of the pull-up circuit PUR0. Those skilled in the art will recognize that, in the embodiment of FIG. 10, the RR calibration and the ZQ calibration of pull-down circuit PDR1 can be similar to that of FIG. 7. In addition, the ZQ calibration of pull-up circuit PUR0 can be similar to that of FIG. 9. Accordingly, for brevity, the RR calibration and ZQ calibration processes in the embodiment of FIG. 10 will not be further discussed.

In the embodiments of FIGS. 9 and 10, the resistances of reference resistance circuits 920, 930, and 1030 can have low values (e.g., 240 ohms). In such embodiments, when manufacturing the memory device 104, the parasitic resistances of the transistors (e.g., transistor ON resistance) of the reference resistance circuits must be kept small so that their effect is negligible. In contrast, in embodiments where the resistance values of the reference resistance circuits are large (e.g., 120 k ohms), some variation in the parasitic resistances is tolerable.

Figure 11:
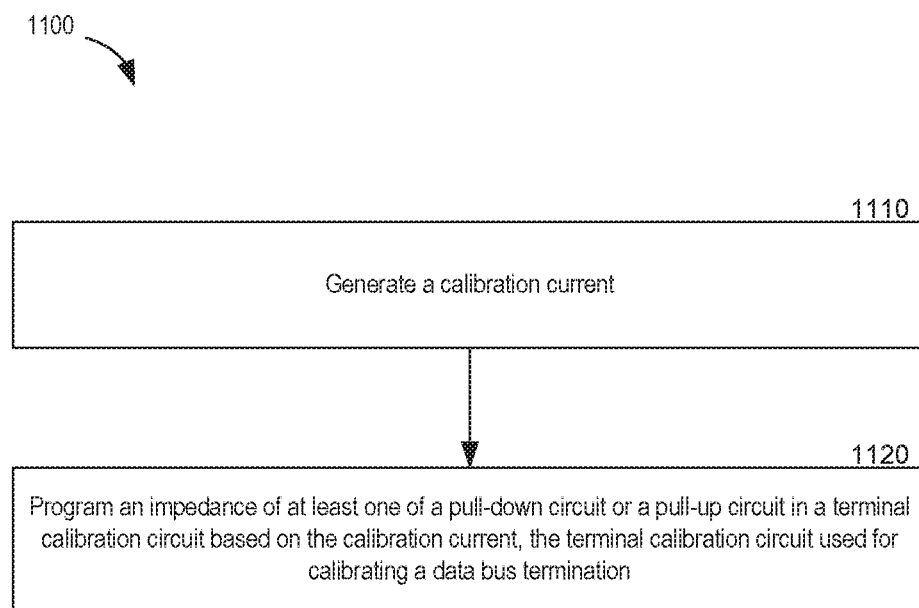
FIG. 11 is a flow diagram for an embodiment of a ZQ calibration procedure in accordance with an embodiment of the present disclosure.

FIG. 11 is a flow diagram illustrating example method 1100 for calibrating a pull-down and/or a pull-up circuit in a terminal calibration circuit. The method 1100 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 1100 is performed by the controller 190 and/or another processor or controller. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 1110, the processing device (e.g., controller 190 and/or another processor or controller) generating a calibration current. For example, as discussed above, current mirror circuit 540, 740 can be configured to generate calibration current $I_{ZQ}$ or $I_{ZQD}$, current mirror circuit 840, can be configured to generate calibration current $I_{ZQD}$ and/or $I_{ZQU}$, and current mirror circuit 940, 1040 can be configured to generate calibration current $I_{ZQD}$.

At block 1120, the processing device (e.g., controller 190 and/or another processor or controller) program an impedance of at least one of a pull-down circuit or a pull-up circuit in a terminal calibration circuit based on the calibration current, the terminal calibration circuit used for calibrating a data bus termination. For example, as discussed above, exemplary embodiments of the present technology calibrate pull-down circuit PDR1 based on calibration current $I_{ZQ}$ or $I_{ZQD}$, as appropriate and/or calibrate pull-up circuit PUR0 based on calibration current $I_{ZQ}$, $I_{ZQU}$, as appropriate.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Additionally, the terms "comprising," "including," "having," and "with" are used throughout to mean including at least the recited feature(s) such that any greater number of the same feature and/or additional types of other features are not precluded.

The processing device (e.g., controller 190 and/or another controller) represents one or more general-purpose processing devices such as a microprocessor, a central processing circuit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., controller 190 and/or another controller) can also be one or more special-purpose processing devices such as an application specific integrated circuit (ASIC), a field programmable gate array (FPGA), a digital signal processor (DSP), network processor, or the like. The processing device (e.g., controller 190 and/or another controller) is configured to execute instructions for performing the operations and steps discussed herein.

The machine-readable storage medium (also known as a computer-readable medium) on which is stored one or more sets of instructions or software embodying any one or more of the methodologies or functions described herein. The machine-readable storage medium can be, for example, memory system 100 or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can comprise a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus, comprising:
a current source circuit configured to generate a reference current that is at a constant value for a predetermined temperature range;
a reference calibration circuit configured to generate a calibration current based on the reference current; and
a terminal calibration circuit for calibrating a data bus termination based on the calibration current,
wherein the reference calibration circuit includes a programmable resistance circuit and the reference calibration circuit is configured to program a resistance of the programmable resistance circuit using the reference current, and
wherein the calibration current is based on the resistance of the programmable resistance circuit.

2. The apparatus of claim 1, wherein the reference calibration circuit includes a second programmable resistance circuit,
wherein the terminal calibration circuit is configured to program a resistance of a pull-down circuit based on the calibration current, and
wherein the terminal calibration circuit is further configured to program a resistance of a pull-up circuit based on the resistance of the second programmable resistance circuit.

3. The apparatus of claim 1, wherein the terminal calibration circuit includes at least one of a pull-down circuit or a pull-up circuit and the terminal calibration circuit is configured to program an impedance of the least one of a pull-down circuit or a pull-up circuit based on the calibration current.

4. The apparatus of claim 1, wherein the terminal calibration circuit is configured to program a resistance of a pull-down circuit based on the calibration current, and
wherein the terminal calibration circuit is further configured to program a resistance of a pull-up circuit based on the programmed resistance of the pull-down circuit.

5. The apparatus of claim 1, wherein the reference calibration circuit is configured to generate a second calibration current,
wherein the terminal calibration circuit programs a resistance of a pull-down circuit based on the calibration current, and
wherein the terminal calibration circuit programs a resistance of a pull-up circuit based on the second calibration current.

6. The apparatus of claim 5, wherein the reference calibration circuit includes a current mirror circuit having a first current mirror portion and a second current mirror portion, and
wherein the first current mirror portion generates the calibration current and the second current mirror portion generates the second calibration current.

7. An apparatus, comprising:
a current source circuit configured to generate a reference current that is at a constant value for a predetermined temperature range;
a reference calibration circuit configured to generate a calibration current based on the reference current; and
a terminal calibration circuit for calibrating a data bus termination based on the calibration current,
wherein the reference calibration circuit includes a current mirror circuit that is configured to provide the calibration current, the current mirror circuit also configured to provide a first current to a reference resistance circuit having a predetermined impedance,
wherein the current mirror circuit is further configured to adjust the first current to maintain an output voltage of the reference resistance circuit at a predetermined reference value, and
wherein the calibration current is based on the first current.

8. The apparatus of claim 7, wherein the reference resistance circuit is a programmable resistance circuit.

9. The apparatus of claim 1, wherein the reference calibration circuit concurrently programs a pull-down circuit and a pull-up circuit of the terminal calibration circuit based on the calibration current.

10. The apparatus of claim 1, wherein the reference calibration circuit sequentially programs a pull-down circuit and a pull-up circuit of the terminal calibration circuit based on the calibration current.

11. A method, comprising:
generating a reference current that is at a constant value for a predetermined temperature range;
generating a calibration current based on the reference current;

programming an impedance of a terminal calibration circuit based on the calibration current, the terminal calibration circuit configured to calibrate a data bus termination, and programming a resistance of a programmable resistance circuit based on the reference current, wherein the generating of the calibration current is based on the resistance of the programmable resistance circuit.

12. The method of claim 11, further comprising:

programming a resistance of a second programmable resistance circuit based on the reference current, wherein the terminal calibration circuit is configured to program a resistance of a pull-down circuit based on the calibration current, and wherein the terminal calibration circuit is further configured to program a resistance of a pull-up circuit based on the resistance of the second programmable resistance circuit.

13. The method of claim 11, wherein the programming the impedance includes programming a resistance of at least one of a pull-down circuit or a pull-up circuit based on the calibration current.

14. The method of claim 11, wherein the programming the impedance includes:

programming a resistance of a pull-down circuit based on the calibration current, and programming a resistance of a pull-up circuit based on the programmed resistance of the pull-down circuit.

15. The method of claim 11, further comprising:

generating a second calibration current, wherein the programming the impedance includes:

programming a resistance of a pull-down circuit based on the calibration current, and programming a resistance of a pull-up circuit based on the second calibration current.

16. A method, comprising:

generating a reference current that is at a constant value for a predetermined temperature range;

generating a calibration current based on the reference current;

programming an impedance of a terminal calibration circuit based on the calibration current, the terminal calibration circuit configured to calibrate a data bus termination, providing a first current to a reference resistance circuit having a predetermined impedance; and controlling the first current to maintain an output voltage of the reference resistance circuit at a predetermined reference value, wherein the calibration current is based on the first current.

17. The method of claim 11, wherein the programming the impedance includes concurrently programming a pull-down circuit and a pull-up circuit.

18. The method of claim 11, wherein the programming the impedance includes sequentially programming a pull-down circuit and a pull-up circuit.

* * * * *